US008817555B2

(12) United States Patent
Ok

(10) Patent No.: US 8,817,555 B2
(45) Date of Patent: Aug. 26, 2014

(54) SEMICONDUCTOR MEMORY DEVICE

(75) Inventor: Sung-Hwa Ok, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 275 days.

(21) Appl. No.: 13/478,727

(22) Filed: May 23, 2012

(65) Prior Publication Data

US 2013/0155791 A1    Jun. 20, 2013

(30) Foreign Application Priority Data

Dec. 19, 2011  (KR) .......................... 10-2011-0137604

(51) Int. Cl.
*G11C 7/00* (2006.01)
(52) U.S. Cl.
USPC ................. 365/189.16; 365/189.14; 365/193; 365/194; 365/233.11; 365/233.12
(58) Field of Classification Search
CPC ............................ G11C 17/22; G11C 17/1006
USPC ............. 365/189.16, 189.14, 233.11, 233.12, 365/193, 194
See application file for complete search history.

(56) References Cited

U.S. PATENT DOCUMENTS

| 7,453,738 | B2 * | 11/2008 | Taruishi et al. ........... 365/189.05 |
| 7,911,824 | B2 * | 3/2011 | Kawai et al. .................. 365/148 |
| 7,911,857 | B1 | 3/2011 | Venkataraman et al. |
| 8,009,500 | B2 * | 8/2011 | Nii et al. ....................... 365/226 |

FOREIGN PATENT DOCUMENTS

| KR | 100755371 | 9/2007 |
| KR | 1020070119378 | 12/2007 |
| KR | 1020120059124 | 6/2012 |

* cited by examiner

*Primary Examiner* — Son Dinh
(74) *Attorney, Agent, or Firm* — IP & T Group LLP

(57) ABSTRACT

A semiconductor memory device includes an internal signal generation unit configured to output a column select signal and a write enable signal in response to an external address, a write circuit unit configured to output internal data corresponding to external data in response to the write enable signal, a core unit configured to store the internal data in response to the column select signal, and an output timing control unit configured to control output timings of the internal signal generation unit and the write circuit unit in response to an external command, an internal synchronization signal, and preamble related information.

20 Claims, 6 Drawing Sheets

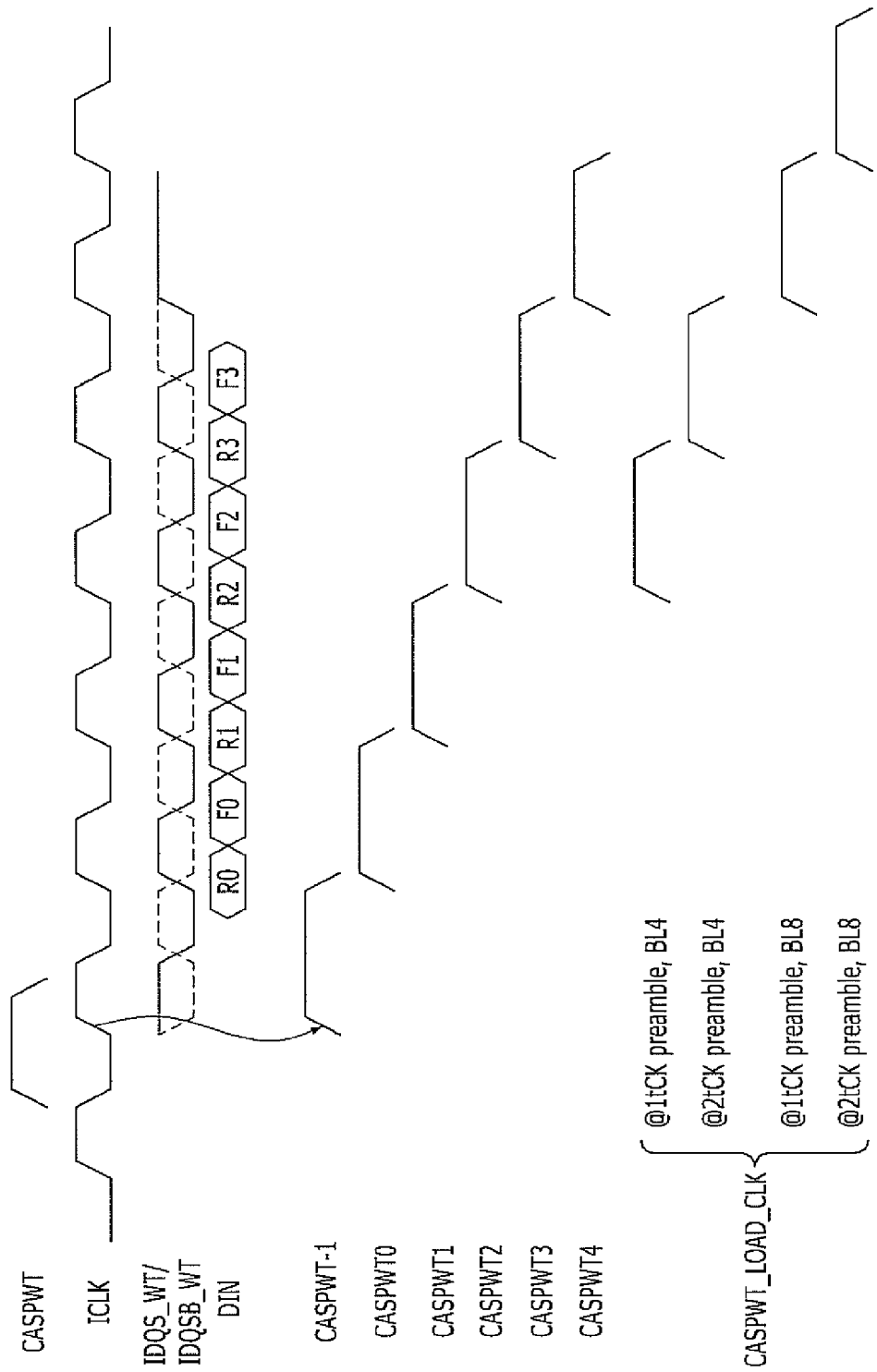

SEMICONDUCTOR MEMORY DEVICE

CROSS-REFERENCE TO RELATED APPLICATIONS

The present application claims priority of Korean Patent Application No. 10-2011-0137604, filed on Dec. 19, 2011, which is incorporated herein by reference in its entirety.

BACKGROUND

1. Field

Exemplary embodiments of the present invention relate to semiconductor design technologies, and more particularly, to a synchronous semiconductor memory device that supports varying preamble periods of a data strobe signal.

2. Description of the Related Art

In general, semiconductor memory devices including DRAM receive write data from a chip set (for example, a memory controller) and transmits read data to the chip set. Meanwhile, in the case of a synchronous semiconductor memory device, both of a chip set and a memory are operated in synchronization with a system clock. However, when data are transmitted to the semiconductor memory device from the chip set, the data and the system clock have different loads and traces, and a skew occurs between the data and the system clock due to a positional difference between the system clock and a plurality of memories.

In order to reduce such a skew between the data and the system clock, the chip set transmits a data strobe signal DQS together with data, when the chip set transmits the data to a memory. The data strobe signal DQS is called an echo clock, and has the same load and trace as data. Therefore, when the memory strobes data using the data strobe signal DQS, a skew occurring due to a positional difference between the system clock and the memory is minimized/reduced. Meanwhile, during a read operation, the memory transmits data and a read strobe signal DQS to the chip set.

Meanwhile, the data strobe signal DQS has a preamble period announcing the beginning of data transmission one period (1tCK) before data is inputted. For example, the data strobe signal DQS starts to toggle in a high impedance (Hi-Z) state or changes to a logic low level in a preamble period.

FIG. 1 is a block diagram illustrating a write path of a conventional semiconductor memory device.

Referring to FIG. 1, the semiconductor memory device 100 includes a command input unit 101, a command decoder 103, an address input unit 105, a column address generation unit 107, an address decoder 109, a strobe command generation unit 111, a data input unit 113, a data alignment unit 115, a data driving unit 117, a write driving unit 119, and a core unit 121.

The command input unit 101 is configured to receive external commands RAS#, CAS#, and WE#. The command decoder 103 is configured to decode the commands inputted through the command input unit 101 and generate first and second internal commands CASP10YA and CASPWT.

The address input unit 105 is configured to receive external addresses A0 to Ak. The column address generation unit 107 is configured to generate column addresses AY0 to AYk corresponding to the addresses inputted through the address input unit 105, in response to the first internal command CASP10YA. The address decoder 109 is configured to generate a write enable signal BWEN and a column select signal YI in response to the column addresses AY0 to AYk.

The strobe command generation unit 111 is configured to generate first and second data alignment control commands CASPWT_LOAD_DQS1 and CASPWT_LOAD_DQS2 by synchronizing the second internal command CASPWT with an internal data strobe signal IDQS_WT in response to first and second burst length information BL4 and BL8, and generate a data driving control command CASPWT_LOAD_CLK by synchronizing the second internal command CASPWT with an internal clock signal ICLK_WT.

The data input unit 113 is configured to receive external data DIN. The data alignment unit 115 is configured to align the data inputted through the data input unit 113 in response to the first and second data alignment control commands CASPWT_LOAD_DQS1 and CASPWT_LOAD_DQS2. The data driving unit 117 is configured to transmit aligned data DIN_ALGN outputted from the data alignment unit 115 to a global input/output line GIO in response to the data driving control command CASPWT_LOAD_CLK.

The write driving unit 119 is configured to output data DIN_GIO transmitted through the global input/output line GIO in response to the write enable signal BWEN. The core unit 121 is configured to store the data outputted from the write driving unit 119 in response to the column select signal YI.

Hereafter, an operation of the conventional semiconductor memory device 100 will be described with reference to FIG. 2.

FIG. 2 is a timing diagram illustrating the operation of the conventional semiconductor memory device 100.

Referring to FIG. 2, the external data DIN having a burst length of '8' are inputted through the data input unit 113 in synchronization with rising and falling edges of the internal data strobe signal IDQS_WT.

Subsequently, the command decoder 103 generates the first and second internal commands CASP10YA and CASPWT corresponding to the external commands RAS#, CAS#, and WE#.

According to an example, the strobe command generation unit 111 outputs the first and second data alignment control commands CASPWT_LOAD_DQS1 and CASPWT_LOAD_DQS2 by synchronizing the second internal command CASPWT with the internal data strobe signal IDQS_WT and outputs the data driving control command CASPWT_LOAD_CLK by synchronizing the second internal command CASPWT with the internal clock signal ICLK_WT. At this time, it can be seen that the first and second data alignment control commands CASPWT_LOAD_DQS1 and CASPWT_LOAD_DQS2 belong to a data strobe signal domain (DQS domain), and the data driving control command CASPWT_LOAD_CLK belongs to a clock signal domain (CLK domain). The data alignment unit 115 first aligns four data R1, F1, R0, and F0 according to the falling edges of the first data alignment control command CASPWT_LOAD_DQS1, and subsequently aligns the other four data R3, F3, R2, and F2 according to the falling edges of the second data alignment control command CASPWT_LOAD_DQS2. In such a state, the data driving unit 117 transmits the aligned data DIN_ALGN through the global input/output line GIO according to rising edges of the data driving control command CASPWT_LOAD_CLK.

Meanwhile, the column address generation unit 107 generates the column addresses AY0 to AYk corresponding to the external addresses A0 to Ak in response to the first internal command CASP10YA, and the address decoder 109 generates the write enable signal BWEN and the column select signal YI according to the column addresses AY0 to AYk.

Accordingly, the write driving unit 119 transmits the data loaded in the global input/output line GIO to the core unit 121 in response to the write enable signal BWEN, and the core unit 121 stores the data transmitted from the write driving unit 119 in a corresponding memory cell (not illustrated) through a bit lines sense amplifier BLSA, in response to the column select signal YI.

However, the semiconductor memory device 100 having the above-described configuration has the following features.

First, a domain crossing margin tDQSS of data will be described briefly before the features of the conventional semiconductor memory device 100 is explained. The domain crossing margin tDQSS of data refers to a permissible range of a skew which occurs between the internal data strobe signal IDQS_WT and the internal clock signal ICLK_WT and may be variously defined according to the specification. Meanwhile, next-generation semiconductor memory devices operating at high speed support a preamble period of the internal data strobe signal IDQS_WT that varies depending on different high speed operations. Accordingly, the data domain crossing margin tDQSS is applied in various manners, according to the varying preamble period of the internal data strobe signal IDQS_WT.

The domain crossing margin tDQSS of the data, which is applied in various manners according to the varying preamble period of the internal data strobe signal IDQS_WT, is to comply with the specification. However, it is not easy to apply the conventional semiconductor memory device 100 so that it supports the varying preamble period of the internal data strobe signal IDQS_WT. In other words, the domain crossing margin tDQSS of data between the second data alignment control command CASPT_LOAD_DQS2 generated from the DQS domain and the data driving control command CASP-WT_LOAD_CLK generated from the CLK domain may be differently set depending on the preamble period, because the specification of the domain crossing margin tDQSS of data differs according to the preamble period of the varying internal data strobe signal IDQS_WT, even though the domain crossing margin tDQSS of the data is to comply with the specification. For example, in a mode where the preamble period supports two cycles (2tCK) of the internal data strobe signal IDQS_WT, the specification of the domain crossing margin tDQSS of the data increases two times more than in a mode where the supported preamble period is equal to one cycle (1tCK) of the internal data strobe signal IDQS_WT. In order to satisfy the specification, the domain crossing margin tDQSS of the data between the second data alignment control command CASPWT_LOAD_DQS2 and the data driving control command CASPWT_LOAD_CLK may be set to a larger value.

Therefore, the output timings of some command signals which are generated during a write operation are to be controlled, in order to satisfy the domain crossing margin tDQSS of the data which is applied in various manners according to the varying preamble period of the internal data strobe signal IDQS_WT.

SUMMARY

An embodiment of the present invention is directed to a semiconductor memory device for controlling output timings of some command signals generated during a write operation, according to a varying preamble period of an internal data strobe signal.

In accordance with an embodiment of the present invention, a semiconductor memory device includes: an internal signal generation unit configured to output a column select signal and a write enable signal in response to an external address; a write circuit unit configured to output internal data corresponding to external data in response to the write enable signal; a core unit configured to store the internal data in response to the column select signal; and an output timing control unit configured to control output timings of the internal signal generation unit and the write circuit unit in response to an external command, an internal synchronization signal, and preamble related information.

In accordance with another embodiment of the present invention, a semiconductor memory device includes: an internal command generation unit configured to generate first and second internal commands in response to an external command; a first command transmission unit configured to, in response to preamble period information, selectively transmit any one of the first internal command and a third internal command obtained by delaying the first internal command by a first period; an internal signal generation unit configured to generate a column select signal and a write enable signal in response to an external address and an internal command transmitted from the first command transmission unit; a strobe command generation unit configured to generate a first strobe command by delaying, in response to an internal synchronization signal, the second internal command by a second period; a second command transmission unit configured to, in response to the preamble period information, selectively transmit any one of the first strobe command and a second strobe command obtained by delaying the first strobe command by the first period; a write circuit unit configured to generate internal data corresponding to external data in response to the write enable signal and a strobe command transmitted from the second command transmission unit; and a core unit configured to store the internal data in response to the column select signal.

BRIEF DESCRIPTION OF THE DRAWINGS

FIGS. 6 and 7 are timing diagrams illustrating the operation of the semiconductor memory device illustrated in FIG. 3.

DETAILED DESCRIPTION

Figure 1:
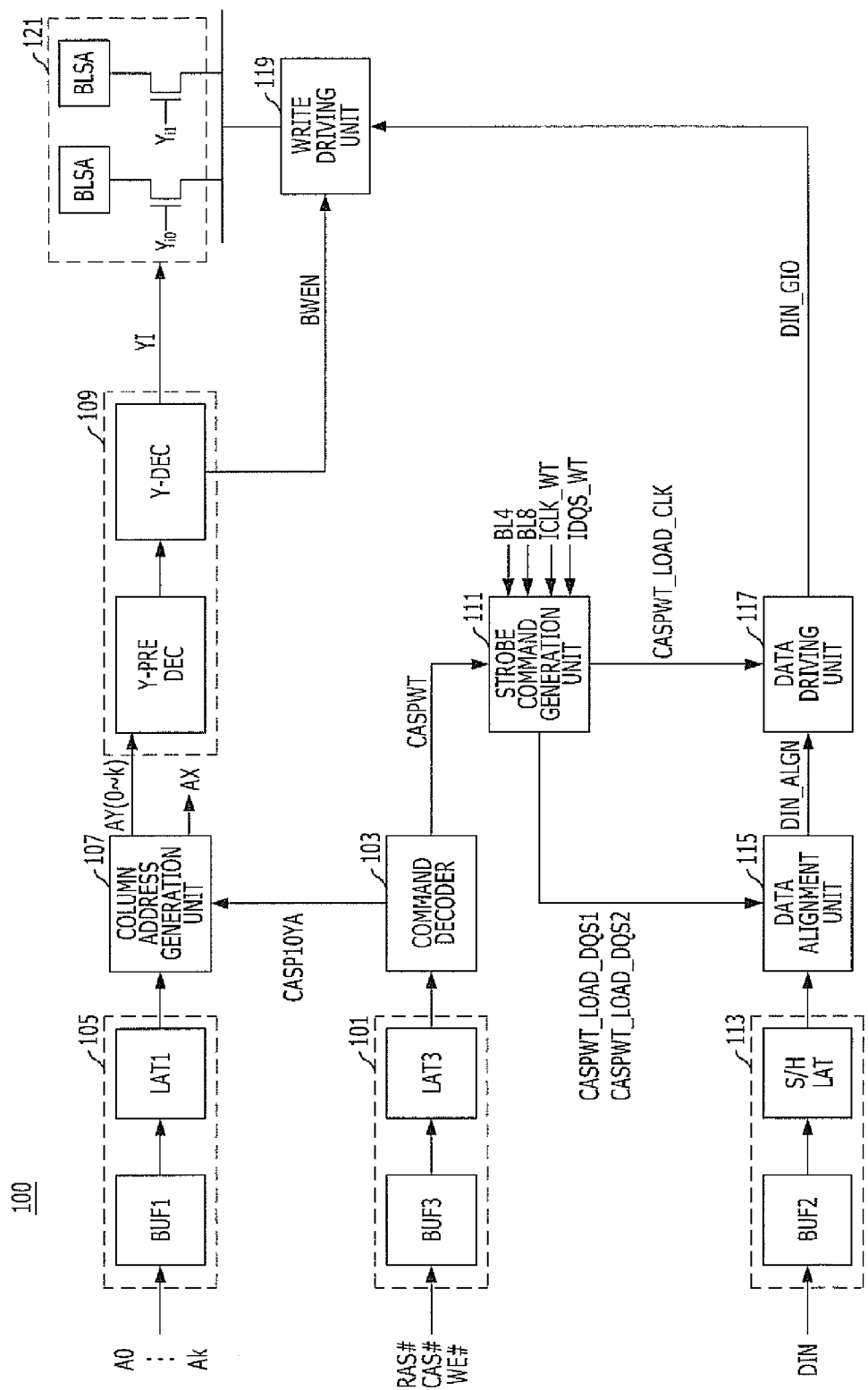
FIG. 1 is a block diagram illustrating a write path of a conventional semiconductor memory device.
Figure 2:
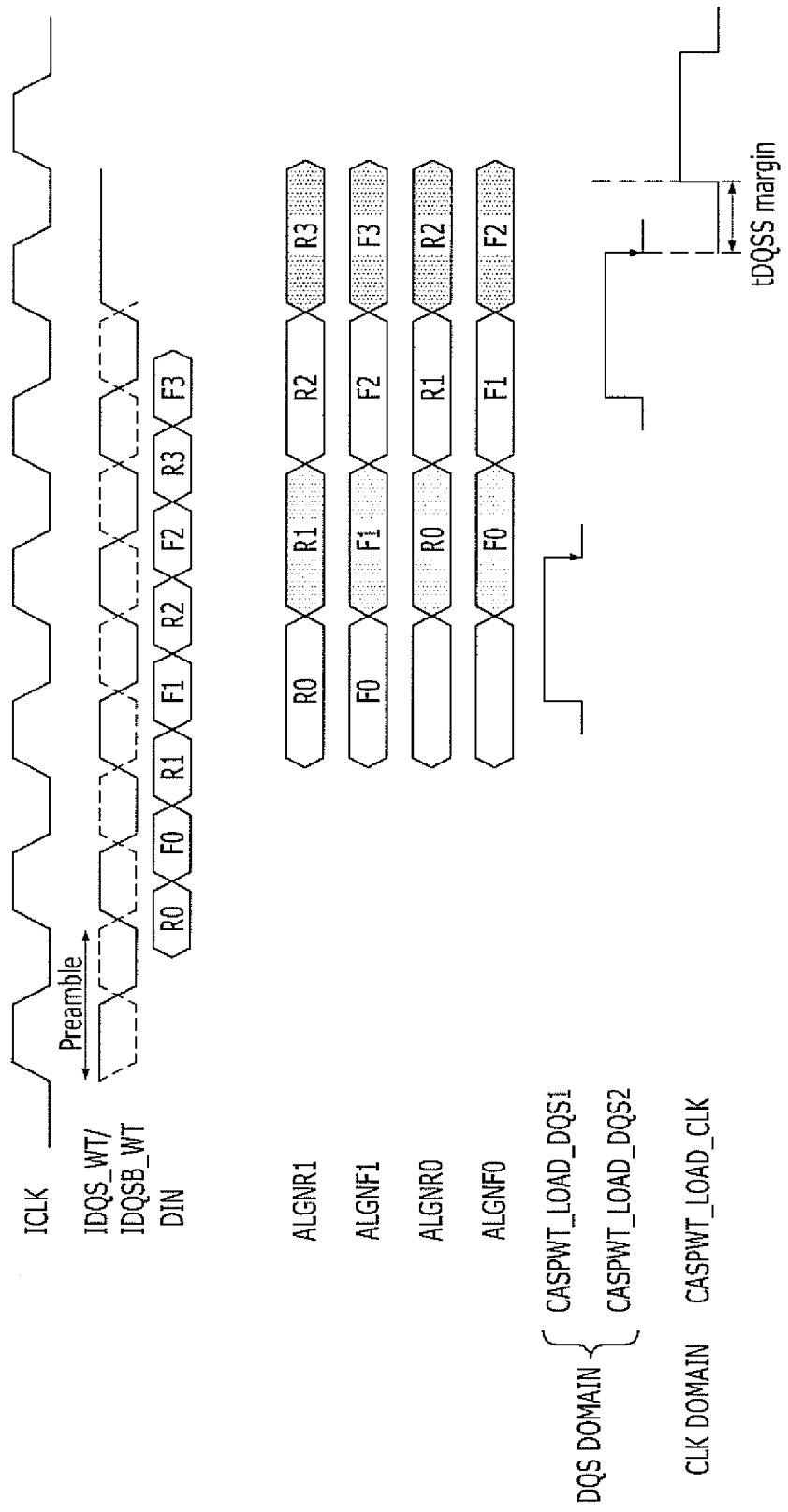
FIG. 2 is a timing diagram illustrating the operation of the conventional semiconductor memory device 100.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the exemplary embodiments of the present invention, a case in which a preamble period of a data strobe signal is equal to '1tCK (one cycle)' or '2tCK (two cycles)' will be described as an example.

Figure 3:
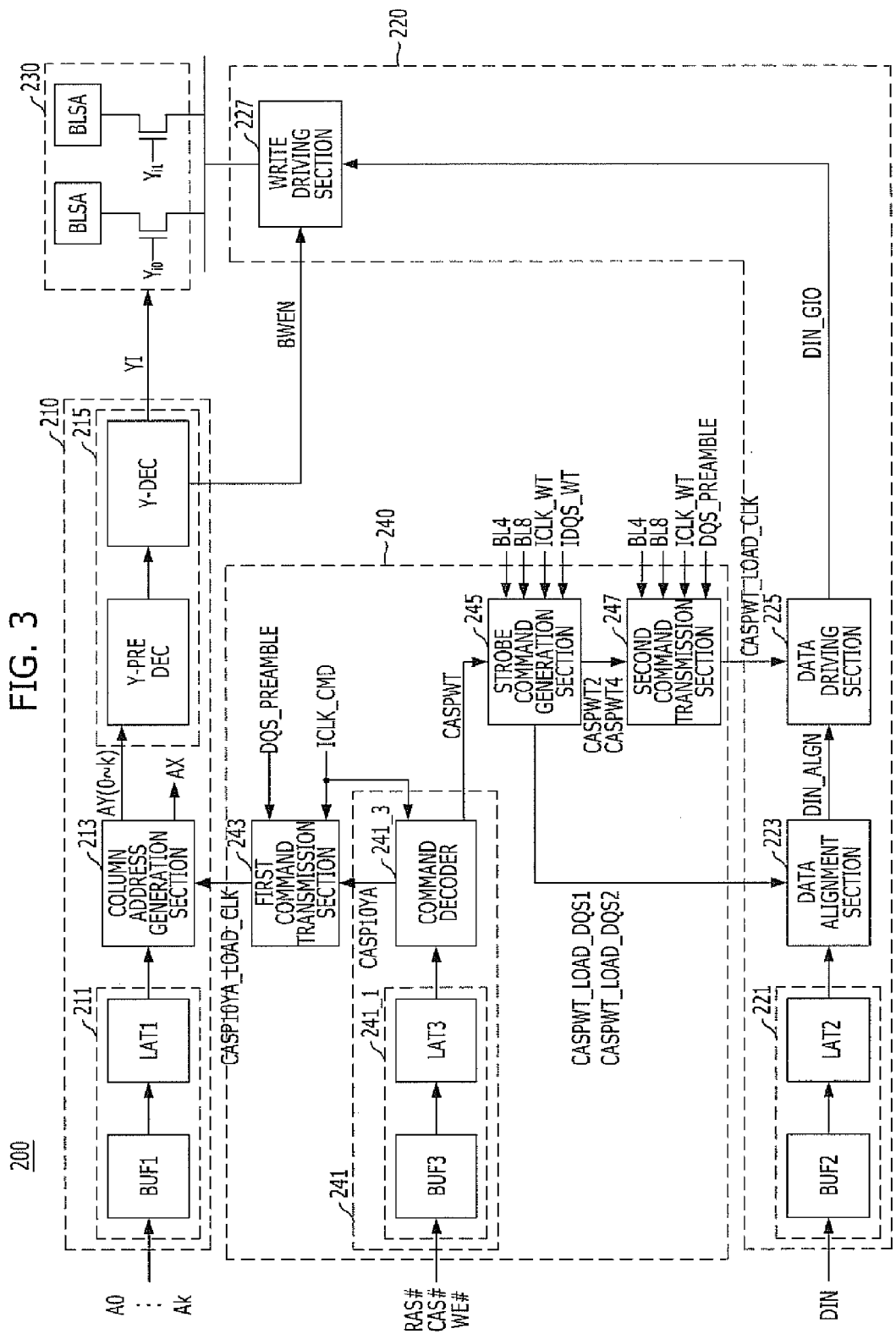
FIG. 3 is a block diagram of a semiconductor memory device in accordance with an embodiment of the present invention.
Figure 4:
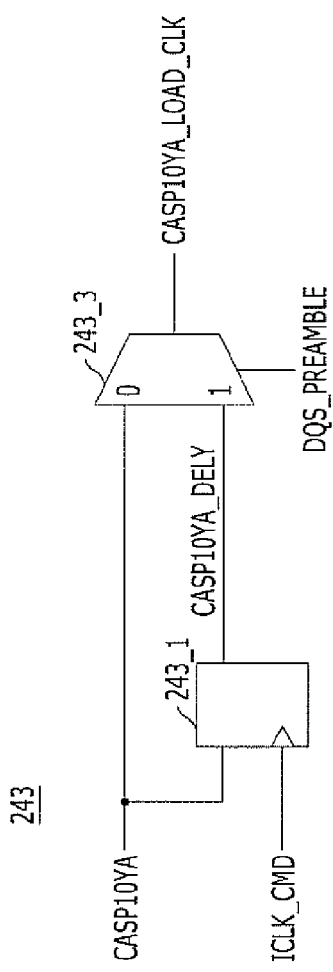
FIG. 4 is an internal configuration diagram of a first command transmission unit illustrated in FIG. 3.
Figure 5:
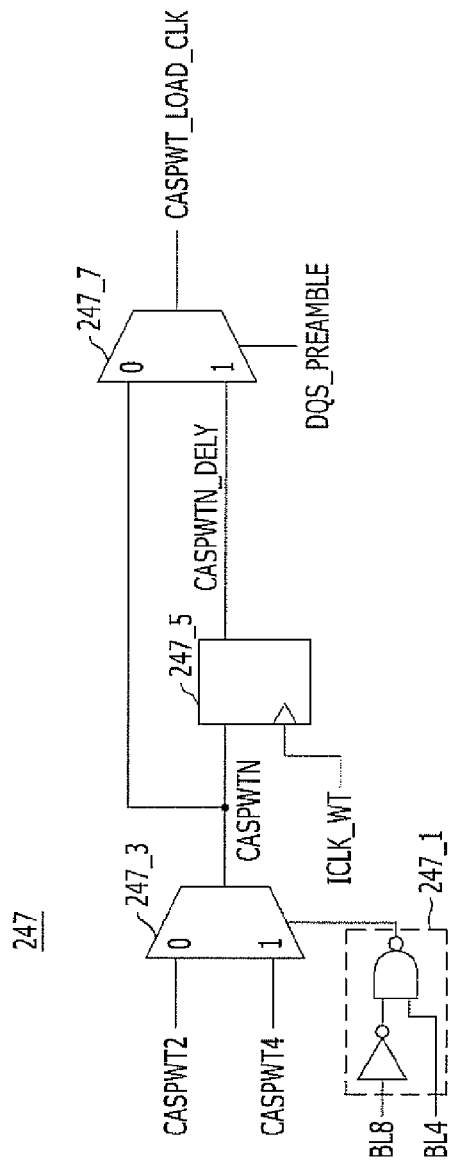
FIG. 5 is an internal configuration diagram of a second command transmission unit illustrated in FIG. 3.

FIG. 3 is a block diagram of a semiconductor memory device in accordance with an embodiment of the present invention. FIG. 4 is an internal configuration diagram of a first command transmission unit illustrated in FIG. 3. FIG. 5 is an internal configuration diagram of a second command transmission unit illustrated in FIG. 3.

Referring to FIG. 3, the semiconductor memory device 200 includes an internal signal generation unit 210, a write circuit unit 220, a core unit 230, and an output timing control unit 240.

The internal signal generation unit 210 is configured to output a column select signal YI and a write enable signal BWEN by receiving external addresses A0 to Ak in response to a column address output control command CASP10YA_LOAD_CLK. The write circuit unit 220 is configured to output internal data corresponding to external data DIN in response to the write enable signal BWEN and internal strobe commands (CASPWT_LOAD_DQS1, CASPWT_LOAD_DQS2, and CASPWT_LOAD_CLK). The core unit 230 is configured to store the internal data in response to the column select signal VI. The timing control unit 240 is configured to generate the column address output control command (CASP10YA_LOAD_CLK and the internal strobe commands CASPWT_LOAD_DQS1, CASPWT_LOAD_DQS2, and CASPWT_LOAD_CLK) to control output timings of the internal signal generation unit 210 and the write circuit unit 220, based on external commands (RAS#, CAS#, and WE#), internal synchronization signals (IDQS_WT, ICLK_WT, and ICLK_CMD) and preamble related information (DQS_PREAMBLE, BL4, and BL8).

Here, the internal synchronization signals IDQS_WT, ICLK_WT, and ICLK_CMD include an internal data strobe signal IDQS_WT and internal clock signals ICLK_WT and ICLK_CMD. Furthermore, the internal strobe commands (CASPWT_LOAD_DQS1, CASPWT_LOAD_DQS2, and CASPWT_LOAD_CLK) are generated by the output timing control unit 240, and include data alignment control commands CASPWT_LOAD_DQS1 and CASPWT_LOAD_DQS2 synchronized with the internal data strobe signal IDQS_WT and a data driving control command CASPWT_LOAD_CMD synchronized with the internal clock signal ICLK_WT. In other words, the data alignment control commands CASPWT_LOAD_DQS1 and CASPWT_LOAD_DQS2 are DQS domain signals, and the data driving control command CASPWT_LOAD_CLK is a CLK domain signal.

Furthermore, the preamble related information DQS_PREAMBLE, BL4, and BL8 includes preamble period information DQS_PREAMBLE representing a preamble period of the internal data strobe signal IDQS_WT and first and second burst length information BL4 and BL8 that each represent a burst length. Here, the preamble period information DQS_PREAMBLE indicates whether the preamble period of the internal data strobe signal IDQS_WT is '1tCK' or '2tCK' according to a logic level, the first burst length information BL4 is activated when 4-bit data are continuously inputted, and the second burst length information BL8 is activated when 8-bit data are continuously inputted. Meanwhile, although not illustrated, the preamble period information DQS_PREAMBLE and the first and second burst length information BL4 and BL8 are provided from a mode register set (MRS).

The internal signal generation unit 210 includes an address input section 211, a column address generation section 213, and an address decoder 215.

The address input section 211 is configured to receive the external addresses A0 to Ak. The column address generation section 213 is configured to generate column addresses AY0 to AYk corresponding to the addresses inputted through the address input section 211 in response to the column address output control command CASP10YA_LOAD_CLK outputted from the output timing control unit 240. The address decoder 215 is configured to decode the column addresses AY0 to AYk and output the column select signal YI and the write enable signal BWEN.

Here, the address input section 211 includes an address buffer BUF1 configured to buffer the external addresses A0 to Ak and an address latch LAT1 configured to latch the addresses buffered by the address buffer BUF1. Furthermore, the address decoder 215 may include an address pre-decoder Y-PREDEC configured to primarily decode the column addresses AY0 to AYk and an address main decoder Y-DEC configured to secondarily decode the column addresses primarily-decoded by the address pre-decoder Y-PREDEC.

The write circuit unit 220 includes a data input section 221, a data alignment section 223, a data driving section 225, and a write driving section 227.

The data input section 221 is configured to receive the external data DIN. The data alignment section 223 is configured to align the data inputted through the data input section 221 in response the first and second data alignment control commands CASPWT_LOAD_DQS1 and CASPWT_LOAD_DQS2 outputted from the output timing control section 240. The data driving section 225 is configured to transmit the data DIN_ALGN aligned by the data alignment section 223 to a global input/output line GIO in response to the data driving control command CASPWT_LOAD_CLK outputted from the output timing control unit 240. The write driving section 227 is configured to transmit the data DIN_GIO transmitted through the global input/output line GIO to the core unit 230 in response to the write enable signal BWEN.

Here, the data input section 221 includes a data buffer BUF2 configured to buffer the external data DIN and a data latch LAT2 configured to latch the data buffered by the data buffer BUF2.

The output timing control unit 240 includes an internal command generation section 241, a first command transmission section 243, a strobe command generation section 245, and a second command transmission section 247.

The internal command generation section 241 is configured to generate first and second internal commands CASP10YA and CASPWT in response to the external commands RAS#, CAS#, and WE#. The first command transmission section 243 is configured to transmit the first internal command CASP10YA as a column address output control command CASP10YA_LOAD_CLK without an additional delay, or delay the first internal command CASP10YA by a desired period (for example, 1tCK) and transmit the delayed first internal command as the column address output control command CASP10YA_LOAD_CLK to the column address generation section 213 in response to the internal clock signal ICLK_CMD and the preamble period information DQS_PREAMBLE.

The strobe command generation section 245 is configured to generate the first and second data alignment control commands CASPWT_LOAD_DQS1 and CASPWT_LOAD_DQS2 by delaying the second internal command CASPWT by designated periods, respectively, in synchronization with the internal data strobe signal IDQS_WT, and generate first and second strobe commands CASPWT2 and CASPWT4 by delaying the second internal command CASPWT by designated periods, respectively, in synchronization with the internal clock signal ICLK_WT. The designated periods are identical to or different from each other according to the first and second burst length information BL4 and BL8.

The second command transmission section 247 is configured to transmit the first strobe command CASPWT2 as the data driving control command CASPWT_LOAD_CLK, or delay the first strobe command CASPWT2 by a designated period (for example, 1tCK) and transmit the delayed first strobe command as the data driving control command CASPWT_LOAD_CLK to the data driving section 225, in response to the first and second burst length information BL4 and BL8, the preamble period information DQS_PREAMBLE, and the internal clock signal ICLK_WT.

Here, the internal command generation section 241 includes a command receiver 241_1 configured to receive the external commands RAS#, CAS#, and WE# and a command decoder 241_3 configured to decode the commands inputted through the command receiver 241_1 and output the first and second internal commands CASP10YA and CASPWT. The command receiver 241_1 includes a command buffer BUF3 configured to buffer the external commands RAS#, CAS#, and WE# and a command latch LAT3 configured to latch the commands buffered by the command buffer BUF3.

The first command transmission section 243 will be described with reference to FIG. 4.

Referring to FIG. 4, the first command transmission section 243 includes a first delay 243_1 configured to delay the first internal command CASP10YA by a designated period (1tCK) and output the delayed first internal command CASP10YA_DELY and a first selector 243_3 configured to selectively output any one of the first internal command CASP10YA and the delayed first internal command CASP10YA_DELY according to the preamble period information DQS_PREAMBLE. The first delay 243_1 may include a D flip-flop configured to delay the first internal command CASP10YA by one cycle (1tCK) of the internal clock signal ICLK_CMD and output the delayed first internal command CASP10YA_DELY. The first selector 243_3 may include a multiplexer configured to select and output any one of the first internal command CASP10YA and the delayed first internal command CASP10YA_DELY according to the logic level of the preamble period information DQS_PREAMBLE.

Furthermore, although not illustrated in detail, the strobe command generation section 245 includes a first circuit and a second circuit. The first circuit is configured to sequentially shift the second internal command CASPWT in response to the internal data strobe signal IDQS_WT and select and output the first and second data alignment control commands CASPWT_LOAD_DQS1 and CASPWT_LOAD_DQS2 among the shifted strobe commands according to the first and second burst length information BL4 and BL8. The second circuit is configured to sequentially shift the second internal command CASPWT in response to the internal clock signal ICLK_WT and generate the first and second strobe commands CASPWT2 and CASPWT4. For example, the first and second circuits may include shifters.

The second command transmission section 247 will be described with reference to FIG. 5.

Referring to FIG. 5, the second command transmission section 247 includes a logic operator 247_1, a second selector 247_3, a second delay 247_5, and a third selector 247_7. The logic operator 247_1 is configured to perform a logic operation on the first and second burst length information BL4 and BL8. The second selector 247_3 is configured to selectively output any one of the first and second strobe commands CASPWT2 and CASPWT4 according to a logic operation result outputted from the logic operator 247_1. The second delay 247_5 is configured to delay the strobe command CASPWTN outputted from the second selector 247_3 by a designated period (for example, 1tCK) and output the delayed strobe command CASPWTN_DELY. The third selector 247_7 is configured to selectively output any one of the strobe command CASPWTN and the delayed strobe command CASPWTN_DELY according to the preamble period information DQS_PREAMBLE.

Here, the logic operator 247_1 may include an inverter configured to invert and output the second burst length information BL8 and a NAND gate configured to perform a NAND operation on an output of the inverter and the first burst length information BL4 and output the logic operation result to the second selector 247_3. Furthermore, the second selector 247_3 may include a multiplexer configured to select and output any one of the first and second strobe commands CASPWT2 and CASPWT4 according to the logic level of the output signal of the logic operator 247_1. Furthermore, the second delay 247_5 may include a D flip-flop configured to delay the strobe command CASPWTN by one cycle (1tCK) of the internal clock signal ICLK_WT and output the delayed strobe command CASPWTN_DELY. Furthermore, the third selector 247_7 may include a multiplexer configured to select and output any one of the strobe command CASPWTN and the delayed strobe command CASPWTN_DELY according to the logic level of the preamble period information DQS_PREAMBLE.

Hereafter, the operation of the semiconductor memory device 200 in accordance with the embodiment of the present invention will be described with reference to FIGS. 6 and 7.

Figure 6:
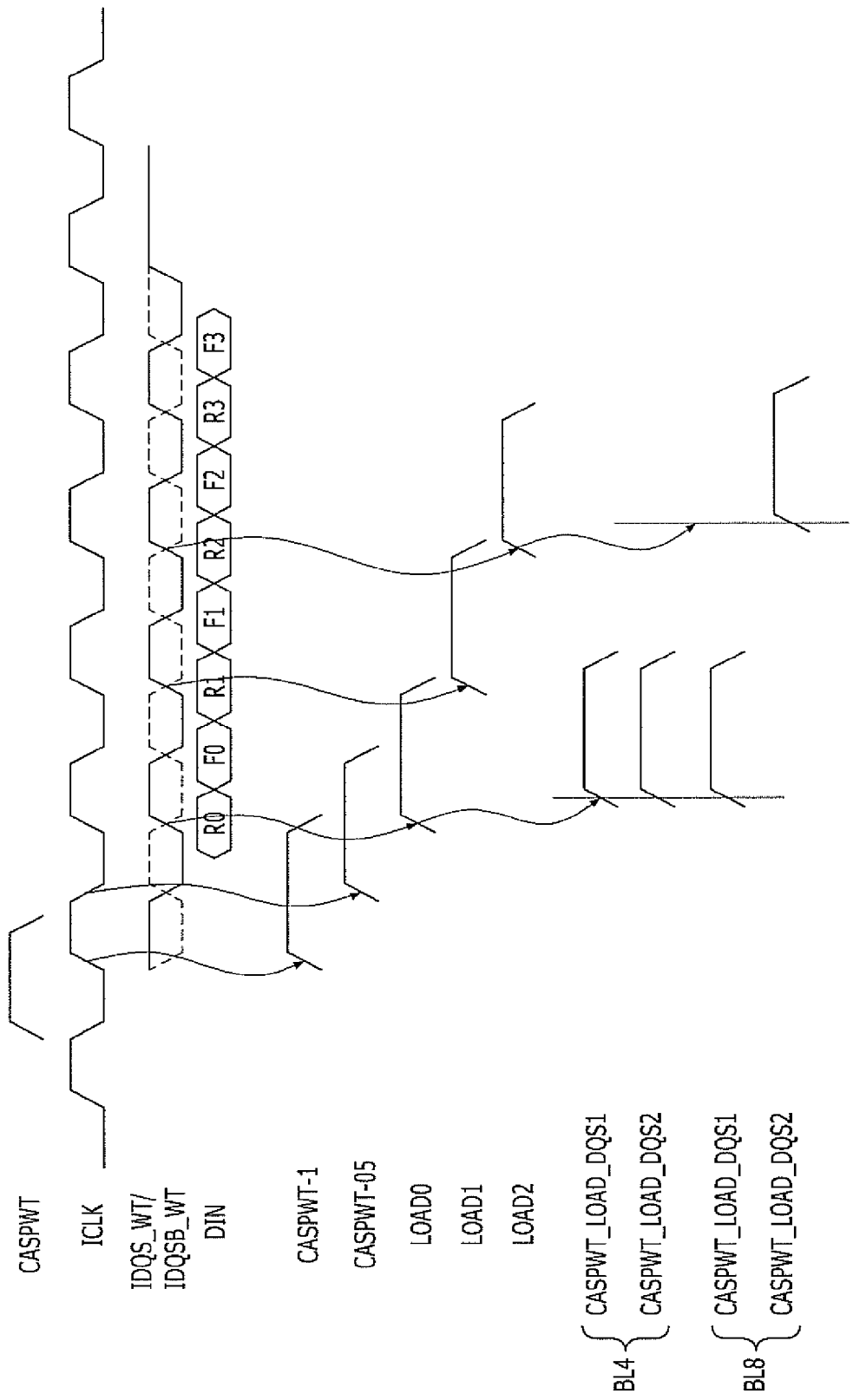

FIG. 6 is a timing diagram illustrating a process in which the semiconductor memory device 200 in accordance with the embodiment of the present invention generates the first and second data alignment control command CASPWT_LOAD_DQS1 and CASPWT_LOAD_DQS2 based on the first and second burst length information BL4 and BL8. FIG. 7 is a timing diagram illustrating a process in which the semiconductor memory device 200 in accordance with the embodiment of the present invention generates the data driving control command CASPWT_LOAD_CLK based on the preamble period information DQS_PREAMBLE.

First, referring to FIG. 6, the command decoder 241_3 generates the second internal command CASPWT according to the inputted external commands RAS#, CAS#, and WE#.

The strobe command generation section 245 synchronizes the second internal command CASPWT with rising edges of the internal data strobe signal IDQS_WT and generates a plurality of shifted strobe commands LOAD0, LOAD1, and LOAD2. Furthermore, the strobe command generation section 245 selects a part of the shifted strobe commands LOAD0, LOAD1, and LOAD2 according to the first and second burst length information BL4 and BL8 and outputs the selected commands as the first and second data alignment control commands CASPWT_LOAD_DQS1 and CASPWT_LOAD_DQS2. At this time, when the first burst length information BL4 is activated, the first and second alignment control commands CASPWT_LOAD_DQS1 and CASPWT_LOAD_DQS2 are outputted at the same timing, and when the second burst length information BL8 is activated, the second data alignment control command CASPWT_LOAD_DQS2 is outputted in a designated period after the first data alignment control command CASPWT_LOAD_DQS1 is outputted. For example, the designated period corresponds to two cycles (2tCK) of the internal data strobe signal IDQS_WT.

Subsequently, the data alignment section 223 aligns the inputted external data DIN in response to the first and second data alignment control commands CASPWT_LOAD_DQS1 and CASPWT_LOAD_DQS2. For example, when it is assumed that the external data DIN have a burst length of '8', the data alignment section 223 aligns first four data in synchronization with falling edges of the first data alignment control command CASPWT_LOAD_DQS1, and subsequently aligns the other four data in synchronization with falling edges of the second data alignment control command CASPWT_LOAD_DQS2.

Referring to FIG. 7, the strobe command generation section 245 synchronizes the second internal command CASPWT with rising edges of the internal clock signal ICLK_WT and generates a plurality of shifted strobe commands CASPWT-1, CASPWT0, CASPWT1, CASPWT2, CASPWT3, and CASPWT4. Subsequently, the strobe command generation section 245 selects and outputs, for example, only the first and second strobe commands CASPWT2 and CASPWT4 among the plurality of shifted strobe commands.

The second command transmission section 247 selects any one of the first and second strobe commands CASPWT2 and CASPWT4 according to the first and second burst length information BL4 and BL8. Subsequently, the second command transmission section 247 outputs the selected strobe command CASPWT as the data driving control command CASPWT_LOAD_CLK or delays the selected strobe command CASPWT by a designated period and outputs the delayed command as the data driving control command CASPWT_LOAD_CLK, according to the preamble period information DQS_PREAMBLE.

For example, when the first burst length information BL4 is activated and the preamble period information DQS_PREAMBLE is deactivated, that is, when the preamble period of the internal data strobe signal IDQS_WT is equal to '1tCK', the first strobe command CASPWT2 is outputted as the data driving control command CASPWT_LOAD_CLK. Alternatively, when the first burst length information BL4 is activated and the preamble period information DQS_PREAMBLE is activated, that is, when the preamble period of the internal data strobe signal IDQS_WT is equal to '2tCK', a strobe command delayed by 'JACK' from the first strobe command CASPWT2 is outputted as the data driving control command CASPWT_LOAD_CLK.

Furthermore, when the second burst length information BL8 is activated and the preamble period information DQS_PREAMBLE is deactivated, that is, when the supported preamble period of the internal data strobe signal IDQS_WT is equal to '1tCK', the second strobe command CASPWT4 is outputted as the data driving control command CASPWT_LOAD_CLK. Alternatively, when the second burst length information BL8 is activated and the preamble period information DQS_PREAMBLE is activated, that is, when the supported preamble period of the internal data strobe signal IDQS_WT is equal to '2tCK', a strobe command delayed by '1tCK' from the second strobe command CASPWT4 is outputted as the data driving control command CASPWT_LOAD_CLK.

Subsequently, the data driving section 225 loads the data DIN_ALGN aligned by the data alignment section 223 into the global input/output line GIO in response to the data driving control command CASPWT_LOAD_CLK.

Meanwhile, the command decoder 241_3 generates the first internal command CASP10YA in response to the inputted external commands RAS#, CAS#, and WE#. At this time, the first internal command CASP10YA may be generated after the second internal command CASPWT, in order to finally control the write circuit unit 220 and the core unit 230 during a write operation.

Furthermore, the first command transmission section 243 outputs the first internal command CASP10YA as the column address output control command CASP10YA_LOAD_CLK according to whether the preamble period information DQS_PREAMBLE is activated or not or delays the first internal command CASP10YA by a designated period and output the delayed first internal command as the column address output control command CASP10YA_LOAD_CLK. For example, when the preamble period information DQS_PREAMBLE is deactivated, that is, the supported preamble period of the internal data strobe signal IDQS_WT is equal to '1tCK', the first internal command CASP10YA is outputted as the column address output control command CASP10YA_LOAD_CLK without an additional delay. On the other hand, when the preamble period information DQS_PREAMBLE is activated, that is, when the supported preamble period of the internal data strobe signal IDQS_WT is equal to '2tCK', an internal command delayed by '1tCK' from the first internal command CASP10YA is outputted as the column address output control command CASP10YA_LOAD_CLK.

Subsequently, the column address generation section 213 generates the column addresses AY0 to AYk corresponding to the external addresses A0 to Ak, and the address decoder 215 outputs the write enable signal BWEN and the column select signal YI according to the column addresses AY0 and AYk.

Accordingly, the write driving section 227 transmits the data DIN_GIO loaded in the global input/output line GIO to the core unit 230 in response to the write enable signal BWEN, and the core unit 230 enables a corresponding bit line sense amplifier BLSA according to the column addresses AY0 and AYk and stores the data in a corresponding memory cell (not illustrated).

In accordance with the embodiment of the present invention, the operation timings of the circuits related to a write operation, such as the data driving section 225, the write driving section 227, and the core unit 230, are controlled in response to a varying preamble period. Therefore, the domain crossing margin tDQSS of data, defined in the specification, may be stably maintained according to the varying preamble period.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
    an internal signal generation unit configured to output a column select signal and a write enable signal in response to an external address;
    a write circuit unit configured to output internal data corresponding to external data in response to the write enable signal;
    a core unit configured to store the internal data in response to the column select signal; and
    an output timing control unit configured to control output timings of the internal signal generation unit and the write circuit unit in response to an external command, an internal synchronization signal, and preamble related information.

2. The semiconductor memory device of claim 1, wherein the internal synchronization signal comprises an internal data strobe signal and an internal clock signal.

3. The semiconductor memory device of claim 1, wherein the preamble related information comprises first information representing a preamble period of the internal data strobe signal and second information representing a burst length.

4. The semiconductor memory device of claim 3, further comprising a mode register set configured to provide the first information and the second information.

5. A semiconductor memory device comprising:
an internal command generation unit configured to generate first and second internal commands in response to an external command;
a first command transmission unit configured to, in response to preamble period information, selectively transmit any one of the first internal command and a third internal command obtained by delaying the first internal command by a first period;
an internal signal generation unit configured to generate a column select signal and a write enable signal in response to an external address and an internal command transmitted from the first command transmission unit;
a strobe command generation unit configured to generate a first strobe command by delaying, in response to an internal synchronization signal, the second internal command by a second period;
a second command transmission unit configured to, in response to the preamble period information, selectively transmit any one of the first strobe command and a second strobe command obtained by delaying the first strobe command by the first period;
a write circuit unit configured to generate internal data corresponding to external data in response to the write enable signal and a strobe command transmitted from the second command transmission unit; and
a core unit configured to store the internal data in response to the column select signal.

6. The semiconductor memory device of claim 5, wherein the internal synchronization signal comprises an internal data strobe signal and an internal clock signal.

7. The semiconductor memory device of claim 6, wherein the preamble period information represents a preamble period of the internal data strobe signal.

8. The semiconductor memory device of claim 7, wherein the strobe command generation unit is further configured to generate one or more internal strobe commands synchronized with the internal data strobe signal and generate a plurality of internal strobe commands by delaying the second internal command by the same period or different periods according to one or more pieces of burst length information.

9. The semiconductor memory device of claim 8, further comprising a mode register set configured to provide the preamble period information and the burst length information.

10. The semiconductor memory device of claim 5, wherein the internal command generation unit comprises:
a first receiver configured to receive the external command; and
a command decoder configured to decode the external command inputted through the first receiver and output the first and second internal commands.

11. The semiconductor memory device of claim 5, wherein the first internal command is generated after the second internal command.

12. The semiconductor memory device of claim 6, wherein the first command transmission unit comprises:

a first delay configured to delay the first internal command by the first period and output the delayed first internal command as the third internal command; and
a first selector configured to selectively output any one of the first internal command and the third internal command according to the preamble period information.

13. The semiconductor memory device of claim 12, wherein the internal command generation unit is configured to generate the first internal command in synchronization with the internal clock signal, and
the first delay is configured to output the third internal command in synchronization with the internal clock signal.

14. The semiconductor memory device of claim 5, wherein the internal signal generation unit comprises:
a second receiver configured to receive the external address;
a column address generator configured to generate a column address corresponding to the external address inputted through the second receiver in response to an internal command transmitted from the first command transmission unit; and
an address decoder configured to decode the column address and output the column select signal and the write enable signal.

15. The semiconductor memory device of claim 14, wherein the address decoder comprises:
an address pre-decoder configured to decode the column address; and
an address main decoder configured to further decode the decoded column address outputted from the address pre-decoder.

16. The semiconductor memory device of claim 6, wherein the strobe command generation unit comprises a shifter configured to sequentially shift the second internal command in response to the internal clock signal.

17. The semiconductor memory device of claim 16, wherein the second command transmission unit comprises:
a second selector configured to selectively output, according to one or more pieces of burst length information, any one of a plurality of first strobe commands that are sequentially outputted from the shifter;
a second delay configured to output the second strobe command by delaying the first strobe command outputted from the second selector by the first period; and
a third selector configured to selectively output any one of the second strobe command and the first strobe command outputted from the second selector, according to the preamble period information.

18. The semiconductor memory device of claim 17, wherein the second command transmission unit further comprises a logic operator configured to perform a logic operation on plural pieces of burst length information when the plural pieces of burst length information are inputted, and
the second selector configured to selectively output any one of the plurality of first strobe commands according to the logic operation result of the logic operator.

19. The semiconductor memory device of claim 17, wherein the second delay is configured to output the second strobe command in synchronization with the internal clock signal.

20. The semiconductor memory device of claim 8, wherein the write circuit unit comprises:
a third receiver configured to receive external data;
a data aligner configured to align the data inputted through the third receiver in response to the second strobe command;

a data driver configured to transmit the data aligned by the data aligner to a global input/output line in response to the strobe command transmitted from the second command transmission unit; and a write driver configured to transmit the data transmitted through the global input/output line to the core unit in response to the write enable signal.

* * * * *